United States Patent [19]

Nonaka et al.

[11] 4,205,334

[45] May 27, 1980

[54] INTEGRATED SEMICONDUCTOR DEVICE

[75] Inventors: Terumoto Nonaka; Tadahiko Hotta; Shin Yamashita, all of Hamamatsu, Japan

[73] Assignee: Nippon Gakki Seizo Kabushiki Kaisha, Hamamatsu, Japan

[21] Appl. No.: 925,624

[22] Filed: Jul. 17, 1978

[30] Foreign Application Priority Data

Jul. 27, 1977 [JP] Japan .................... 52-90146

[51] Int. Cl.$^2$ .................................... H01L 27/02
[52] U.S. Cl. ........................ 357/41; 357/22; 357/50; 357/55
[58] Field of Search ............. 357/41, 22, 50, 55

[56] References Cited

U.S. PATENT DOCUMENTS 4,117,587 10/1978 Kano et al. ................... 357/41

Primary Examiner—Edward J. Wojciechowicz
Attorney, Agent, or Firm—Cushman, Darby & Cushman

[57] ABSTRACT

An integrated semiconductor device including at least one first vertical-type junction field effect transistor (vertical JFET) having a triode-like unsaturated voltage-current characteristic and at least one second vertical JFET having a bipolar-transistor-like saturated voltage-current characteristic, both being integrally formed in a semiconductor body. Both the first and second vertical JFET are much similar in general arrangement to each other, thus allowing simultaneous forming thereof by the same manufacturing process, without sacrificing the good characteristics of these two types of transistors.

6 Claims, 4 Drawing Figures

INTEGRATED SEMICONDUCTOR DEVICE

BACKGROUND OF THE INVENTION (a) Field of the Invention

The present invention is related to an integrated semiconductor device, and more particularly it pertains to an integrated semiconductor device including transistors having a triode-like unsaturated voltage-current characteristic and transistors having a bipolar-transistor-like saturated voltage-current characteristic.

(b) Description of the Prior Art

In the past, in the field of manufacture of integrated circuit devices, attempts have been made to carry out integration, in a common semiconductor substrate, of a vertical type junction field effect transistor (vertical JFET), a certain type of which is often referred to as a static induction transistor, and a lateral type or vertical type bipolar transistor, by forming these transistors relying on common forming techniques in many of their forming steps.

As is well known, a vertical JFET has the following excellent features and advantages which include: (a) high input impedance; (b) large transconductance $G_m$; (c) no minority carrier storage effect; (d) low series resistance of gate; (e) high breakdown voltage; (f) small inter-electrode capacitance; (g) low noise property; and (h) negative temperature property. Thus, a vertical JFET exhibits these features when applied to linear circuits and like devices. However, this vertical JFET is of the normally-on type, and accordingly this transistor has some difficulty in, for example, the biasing system and circuit connections. Thus, there is the need that this vertical JFET be combined with a bipolar transistor when an integrated circuit is formed by the use of this transistor. As a bipolar transistor which is to be combined with a vertical JFET as stated above, it is advantageous from the viewpoint of manufacture to use a lateral type bipolar transistor because of the simplicity in its formation. However, a lateral type bipolar transistor, by nature, does not provide for sufficient desirable characteristics in the light of its structure, and this bipolar transistor is used only for exhibiting very limited functions.

In contrast thereto, a vertical type bipolar transistor exhibits sufficient desirable characteristics structurally, and therefore it can be utilized to exhibit various functions. However, in case this vertical type bipolar transistor is applied to integration jointly with a vertical JFET, it is often the case that, for the purpose of simplifying the manufacturing steps, the collector and the drain, the base and the gate, and the emitter and the source of this bipolar transistor and said FET are formed by relying on a common epitaxial growth technique or common diffusion technique, respectively. Thus, some compromise with respect to their characteristics cannot be avoided. Especially, the width and the impurity concentration of the base region of the vertical type bipolar transistor constitute important parameters for the characteristics of this bipolar transistor. Nevertheless, these items are determined by taking into consideration the depth and the impurity concentration of the gate region of the vertical JFET. In this respect, the inherent characteristics of the vertical type bipolar transistor are subjected to limitations to some extent. In a similar way, the characteristics of said FET are also inevitably subjected to some limitations. In order to eliminate such limitations, it would be necessary to manufacture the vertical JFET and the vertical type bipolar transistor separately. This, however, will result in complicated manufacturing steps and accordingly will reduce the value and advantage of integration to half.

Recently, an improved arrangement for a vertical-structure bipolar transistor suitable for integration with a vertical JFET has been proposed by Terumoto NONAKA, one of the present inventors, in Japanese Patent Application No. 52-50258 (corresponding U.S. Ser. No. 899,588 filed on Apr. 24, 1978) entitled INTEGRATED LOGIC CIRCUIT ARRANGEMENT. This proposed bipolar transistor, surely, is easier to be formed integrally with the vertical JFET as compared with the known conventional vertical-structure bipolar transistor, but still cannot be formed by the same manufacturing steps as those for the vertical JFET. Also, when integrated with the vertical JFET, it is necessarily accompanied by some degradation in performance due to the limitation in the designing requirements of the vertical JFET.

SUMMARY OF THE INVENTION

The principal feature of the integrated semiconductor device according to the present invention is found in that a vertical type junction FET having a triode vacuum tube-like unsaturating characteristic and another vertical type junction FET having a pentode vacuum tube-like saturating characteristic are formed in a common semiconductor substrate, in which these two types of transistors have structures substantially similar to each other. The words "structures similar to each other" herein used especially concern the gate regions of these two transistors. That is, these regions of the two transistors each are formed in such a pattern as having, when viewed in section, two portions. In the vertical type junction FET of the unsaturating type, the distance between the above-said two portions of the gate region is determined so that that portion sandwiched between these two portions will function as a vertically conducting channel, whereas in the saturating type FET, the similar distance is determined so that the portion sandwiched between the two portions of the gate region will become normally (at zero bias) pinched off by the depletion layers extending from the two portions of the gate region. The source region of the saturating type FET is formed so as to lie between said two portions of the gate region in adjacent relationship thereto.

According to such structural features of the present invention, these two types of transistors can be manufactured by commonly utilizing the manufacturing steps such as the epitaxial growth or diffusion techniques only by specifying the planar geometrical dimensions of the respective transistors.

In addition, because these two types of transistors employed in the present invention have a similar structure, there hardly arises the inconvenience encountered in the prior art that the parameters specified for one of the transistors degradate the inherent characteristics of the other one of the transistors. Rather, the desirable characteristics of these two types of transistors are exhibited without being appreciably sacrificed. It is, therefore, a general object of the present invention to provide a novel integrated semiconductor device which incorporates transistors having an unsaturated voltage-current characteristic like that of a triode vacuum tube and transistors having a saturated voltage-current characteristic like that of a bipolar transistor, both being integrally formed in the same semiconductor body, and which is easy to manufacture without sacrificing the inherent desirable charcteristics of these two types of transistors.

An integrated semiconductor device according to the present invention comprises at least one first vertical JFET and at least one second vertical JFET both formed integrally in a semiconductor body. Both the first and second vertical JFETs are similar in arrangement to each other, thus allowing their simultaneous formation by relying on the same manufacturing process. However, the first vertical JFET is given such physical dimensions and impurity concentrations for its respective constituting semiconductor regions that it provides for a triode-like unsaturated voltage-current characteristic, while the second vertical JFET has such physical dimensions and impurity concentrations for its respective constituting semiconductor regions thereof that it exhibits a bipolar-transistor-like saturated voltage-current characteristic.

These and other objects as well as the advantages and the features of the present invention will become apparent by reading the following detailed description when taken in conjunction with the accompanying drawings.

DETAILED DESCRIPTION OF THE PREFERRED EMBODIMENT

Figure 1:
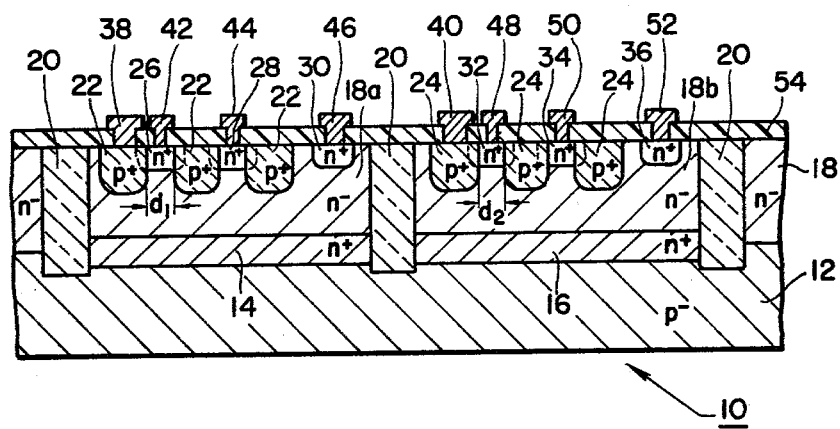
FIG. 1 is a diagrammatic vertical section of an example of an integrated semiconductor device according to the present invention.

FIG. 1 shows, in vertical section, an example of the integrated semiconductor device according to the present invention, which includes a semiconductor body 10 in which are integrally formed at least one first vertical JFET having a triode vacuum-like unsaturated voltage-current characteristic and at least one second vertical JFET having a biplar-transistor-like saturated voltage-current characteristic. The semiconductor body 10 is composed of a lightly doped p⁻ type semiconductor substrate 12 and a lightly doped n⁻ type semiconductor layer 18 which is formed on the substrate 12 by relying on, for instance, the known epitaxial growth technique. The substrate 12 and the layer 18 may be made of, for instance, silicon. The impurity concentration for the layer 18 may be, generally, be determined at the order of $10^{18} \sim 10^{21}$ atoms/m³ in case the semiconductor material is silicon. In the semiconductor layer 18 are formed isolated islet regions 18a and 18b which are isolated from each other by an isolation grid 20 and also isolated from the substrate 12 by heavily doped n⁺ type buried regions 14 and 16. The isolation grid 20 may be of an insulator material such as silicon dioxide, or a p type semiconductor. The buried regions 14 and 16 may be formed by, for instance, selectively diffusing appropriate impurity elements at the corresponding surface of the substrate 12 prior to the growth of the semiconductor layer 18. The impurity concentration for the n⁺ type regions 14 and 16 may generally be determined at the order of $10^{24} \sim 10^{27}$ atoms/m³ for silicon.

In the vicinity of the upper surface of the islet region 18a, there is formed a heavily doped p⁺ type region 22 which has a mesh-like or stripe-like pattern in top plan view and has three finger portions each facing adjacent one at a distance $d_1$. In the upper portions of those portions of the islet region 18a which are surrounded or sandwiched by the finger portions of the region 22, there are formed heavily doped n⁺ type semiconductor regions 26 and 28. Similarly, in the vicinity of the upper surface of the islet region 18b is provided a heavily doped p⁺ type region 24 which has a mesh-like or stripe-like pattern in top plan view and has three finger portions each facing adjacent one at a distance $d_2$. In the upper portions of those portions of the islet region 18b which are surrounded or sandwiched by the respective finger portions of the region 24, there are provided heavily doped n⁺ type regions 32 and 34. In the embodiment, there are further provided, in the vicinity of the upper surfaces of the islet regions 18a and 18b, heavily doped n⁺ type regions 30 and 36 for electrically leading the regions 14 and 16 out of the upper surface of the regions 18a and 18b through these regions, respectively. The regions 30 and 36 may extend to contact the regions 14 and 16, respectively. On the respective regions 22 through 36 are deposited ohmic contact electrodes 38 through 52. The impurity concentration for the p⁺ type regions 22 and 24 may generally be determined to be of the order of $10^{24} \sim 10^{27}$ atoms/m³. The impurity concentration for the n⁺ type regions 26 through 36 may be determined to be of the order of $10^{24} \sim 10^{27}$ atoms/m³. Reference numeral 54 represents a passivation film of an insulator material, e.g. silicon dioxide.

The aforementioned first vertical JFET is comprised of the regions 14, 18a, 22, 26 and 28. More particularly, the region 14 serves as the drain; the region 22, as the gate; the regions 26 and 28, as the sources; and those portions of the region 18a which are surrounded by the respective finger portions of the gate region 22, as the current channels oriented perpendicular to the upper surface of the region 18a. Similarly, the aforementioned second vertical JFET is comprised of the region 16 (drain), the region 24 (gate), the regions 32 and 34 (sources), and those portions (current channels) of the region 18b which are surrounded by the respective finger portions of the gate region 24. It should be noted, however, that the drian regions 14 and 16 and the source regions 26, 28, 32 and 34 are exchangeable, in function, to each other, respectively.

The physical dimension and impurity concentration for the respective regions constituting the first vertical JFET are determined so that the first vertical JFET will exhibit a triode-like voltage-current characteristic. While, the second vertical JFET is given such physical dimension and impurity concentration for the respective constituting regions that it will have a bipolar-transistor-like saturated voltage-current characteristic. In general, the distances $d_1$ and $d_2$, i.e. the gate widths of the vertical JFETs, and the impurity concentration for the current channel regions are particularly critical for determining the characteristic of the vertical JFETs. As for the second vertical JFET, it is preferable to determine the gate width $d_2$ so that the current channel regions will be completely depleted only by the diffusion potential between the channel regions and the gate region and that the vertical JFET will provide a good cut-off characteristic.

Figure 2A:
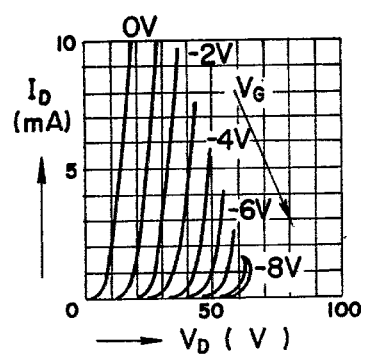
FIGS. 2A and 2B are charts for illustrating exemplary voltage-current characteristics of the first and second vertical JFETs in the device of FIG. 1, respectively.
Figure 2B:
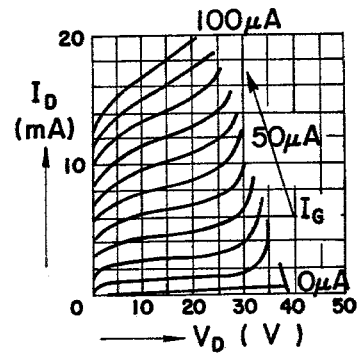
Figure 3:
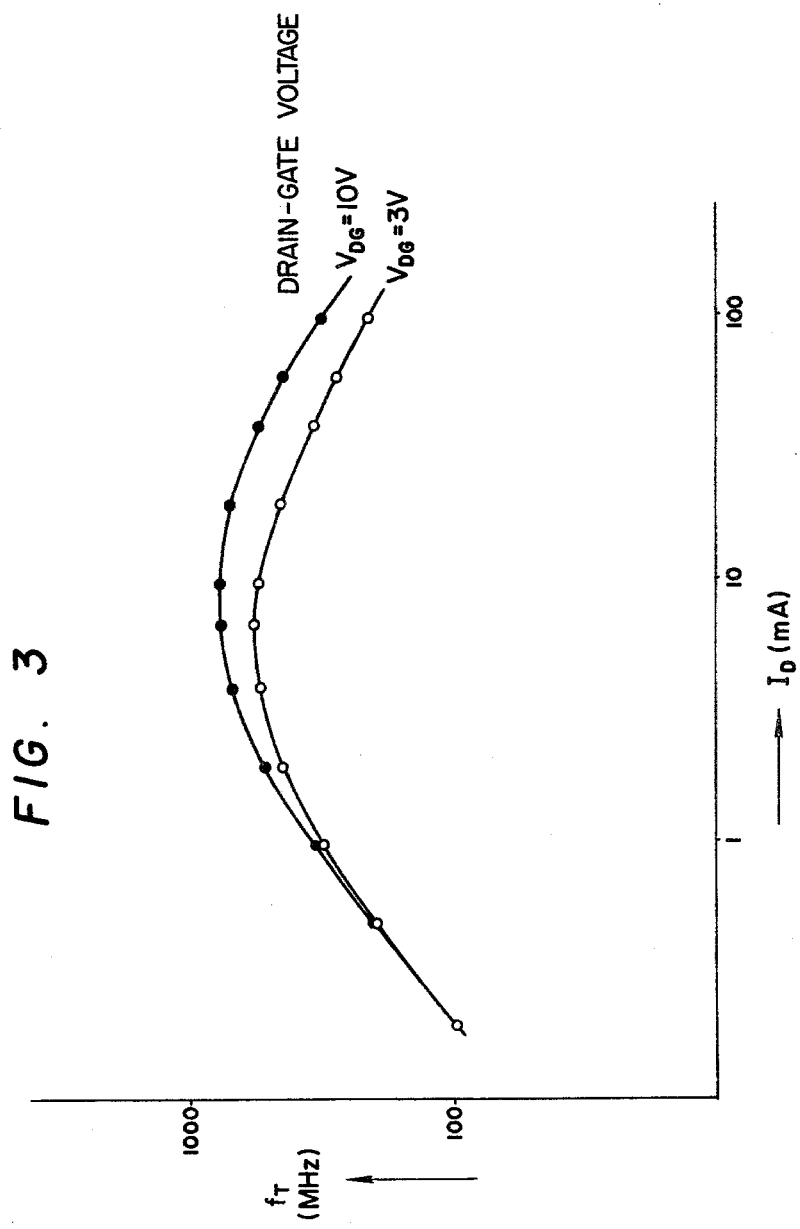
FIG. 3 is a chart for illustrating exemplary plot curves of the drain current vs. cut-off frequency characteristic of the second vertical JFET in the device of FIG. 1.

Under the following designing conditions, the drain voltage ($V_D$) vs. the drain current ($I_D$) characteristics of the first and second vertical JFETs are shown in FIGS. 2A and 2B, respectively, and the cut-off frequency ($f_T$) characteristic of the second vertical JFET is as shown in FIG. 3.

DESIGNING CONDITIONS (a) impurity concentration for regions 18a and 18b: about $5 \times 10^{19}$ atoms/m$^3$;
(b) thickness of the regions 18a and 18b: about 5 µm;
(c) diffusion depth of regions 26, 28, 32 and 34: 0.1~0.5 µm;
(d) diffusion depth of regions 22 and 24: 2~3 µm;
(e) gate width $d_1$: 6~10 µm; and
(f) gate width $d_2$: 4~6 µm.

As seen from FIG. 2A, the voltage-current characteristic of the first vertical JFET is similar to that of a triode vacuum tube. Also, FIG. 2B shows clearly that the second vertical JFET provides for a saturated voltage-current characteristic resembling that of a bipolar transistor, and a high current gain as well as a high reverse drain-source breakdown voltage. Furthermore, as shown in FIG. 3, the vertical JFET has a good frequency response characteristic. In FIGS. 2A and 2B, $V_G$ represents the gate voltage applied across the gate and the source of the first vertical JFET, and $I_G$ represents the gate current flowing into the gate of the second vertical JFET.

As explained above, both the first and second vertical JFETs are substantially the same in general arrangement, and the characteristics of the respective vertical JFETs can be determined optimum, almost independently of each other by, for example, individually selecting the gate widths for the respective vertical JFETs without changing the other designing conditions. Accordingly, both the first and second vertical JFETs can be formed easily simultaneously by relying on the same manufacturing process. Thus, the integrated semiconductor device of the present invention is easy to manufacture without sacrificing the desirable characteristics of the two types of component transistors.

The integrated semiconductor device according to the present invention has an excellent high breakdown voltage property. Thus, it is suitable for being applied to linear circuits. In view of the fact further that it is much common in manufacturing steps to a static induction transistor logic integrated circuit (which is called SITL), the semiconductor integrated circuit of the present invention can be present jointly with SITL in an integrated circuit.

It should be understood, here, that the conductivity types for the respective semiconductor regions can be reversed as a whole. Further, the number of the current channels of the respective vertical JFETs may be altered arbitrarily and independently of each other.

What is claimed is:

1. An integrated semiconductor device including at least one normally-on type first junction field effect transistor and at least one normally-off type second junction field effect transistor both being formed in a single common semiconductor body,
said first transistor comprising: a first semiconductor region having a first conductivity type and formed in said semiconductor body; a gate region having a second conductivity type opposite to said first conductivity type and provided in said first semiconductor region to surround at least one portion of said first semiconductor region, thereby defining at least one current channel region oriented perpendicular to one surface of said semiconductor body; at least one source region having said first conductivity type and provided at one end of said current channel region; and at least one drain region having said first conductivity type and provided at the other end of said current channel region,
the width of said channel region in a direction parallel to a principal surface of said semiconductor body being such as to cause the channel region to be rendered conductive in the absence of external bias being applied to said gate region during operation of said first transistor,
said second transistor comprising: a second semiconductor region having said first conductivity type and formed in said semiconductor body but isolated from said first semiconductor region and having the same impurity concentration as said first semiconductor region; a gate region having said second conductivity type and provided in said second semiconductor region to surround at least one portion of the second semiconductor region, thereby defining at least one current channel region oriented perpendicular to said one surface of said semiconductor body; at least one source region having said first conductivity type and provided at one end of the current channel region of the second transistor; and at least one drain region having said first conductivity type and provided at the other end of said current channel region of said second transistor,
said channel region for the second transistor having in said direction a width less than the first transistor channel region width and such as to cause this channel region to become substantially pinched off by a depletion layer extending from the p-n junction between said gate and channel regions for said second transistor in the absence of external bias being applied to the second transistor gate region during operation of said second transistor.

2. An integrated semiconductor device according to claim 1, in which: one of said source region and drain region of each of said first and second transistors is provided in the vicinity of said one surface of said semiconductor body.

3. An integrated semiconductor device according to claim 2, in which: said gate region of each of said first and second transistors is provided in the vicinity of said one surface of said semiconductor body.

4. An integrated semiconductor device according to claim 2, further comprising: semiconductor regions having said first conductivity type and provided in said semiconductor body for electrically leading the remaining other ones of said source and drain regions of said first and second transistors out of said one surface of said semiconductor body, respectively.

5. An integrated semiconductor device according to claim 1, in which: said first and second semiconductor regions are composed of silicon having an impurity concentration between $10^{18}$ and $10^{21}$ atoms/m$^3$, said source and drain regions of both said first and second transistors are composed of silicon having an impurity concentration between $10^{24}$ and $10^{27}$ atoms/m$^3$, and said gate regions of both said first and second transistors are composed of silicon having an impurity concentration between $10^{24}$ and $10^{27}$ atoms/m$^3$.

6. A device as in claim 1, 2, 3, 4 or 5 characterized by said first transistor having an unsaturating characteristic and said second transistor having a saturated characteristic.

* * * * *